United States Patent
Hsu et al.

(10) Patent No.: US 7,238,586 B2
(45) Date of Patent: Jul. 3, 2007

(54) SEAMLESS TRENCH FILL METHOD UTILIZING SUB-ATMOSPHERIC PRESSURE CHEMICAL VAPOR DEPOSITION TECHNIQUE

(75) Inventors: Shao-Ta Hsu, Tai-Nan (TW); Neng-Kuo Chen, Hsin-Chu (TW); Teng-Chun Tsai, Hsin-Chu (TW)

(73) Assignee: United Microelectronics Corp., Hsin-Chu (TW)

( * ) Notice: Subject to any disclaimer, the term of this patent is extended or adjusted under 35 U.S.C. 154(b) by 0 days.

(21) Appl. No.: 11/161,074

(22) Filed: Jul. 21, 2005

(65) Prior Publication Data
US 2007/0020875 A1    Jan. 25, 2007

(51) Int. Cl.
*H01L 21/76* (2006.01)
(52) U.S. Cl. ............... 438/424; 438/438; 257/E21.547
(58) Field of Classification Search .......... 438/424, 438/438, FOR. 277; 257/E21.546
See application file for complete search history.

(56) References Cited

U.S. PATENT DOCUMENTS

| | | | | |
|---|---|---|---|---|
| 5,492,858 A * | 2/1996 | Bose et al. | ............... | 438/437 |
| 6,177,344 B1 * | 1/2001 | Xia et al. | ............... | 438/646 |
| 6,218,268 B1 * | 4/2001 | Xia et al. | ............... | 438/435 |
| 2004/0083964 A1 * | 5/2004 | Ingle et al. | ............... | 118/715 |
| 2006/0030165 A1 * | 2/2006 | Ingle et al. | ............... | 438/795 |

* cited by examiner

*Primary Examiner*—Brook Kebede
*Assistant Examiner*—John M Parker
(74) *Attorney, Agent, or Firm*—Winston Hsu

(57) ABSTRACT

A seamless trench fill method utilizing ozone-assisted sub-atmospheric pressure chemical vapor deposition (SACVD) technique is provided. After the deposition of a SACVD silicon oxide film, the substrate is subjected to a steam anneal that is performed under $H_2/O_2$ environment at a relatively lower temperature ranging between 500° C. and 800° C. for a time period of no less than 30 minutes. The seam defect in the trench is effectively eliminated by this low-temperature steam anneal. To densify the SACVD silicon oxide film, a subsequent $N_2$ anneal is carried out at a higher temperature, for example, 1050° C.

5 Claims, 6 Drawing Sheets

SEAMLESS TRENCH FILL METHOD UTILIZING SUB-ATMOSPHERIC PRESSURE CHEMICAL VAPOR DEPOSITION TECHNIQUE

BACKGROUND OF INVENTION

1. Field of the Invention

The present invention relates to the field of microelectronics fabrication and, more particularly, to a seamless trench-fill process utilizing sub-atmospheric pressure chemical vapor deposition (SACVD) technique.

2. Description of the Prior Art

Trench isolation techniques such as shallow trench isolation (STI) processes are known in the art. Generally, to form an STI isolation region on a substrate, a recess is first etched into the substrate, and then filled with an insulating dielectric film, which is typically a CVD silicon oxide film. Subsequently, a chemical mechanical polishing (CMP) process is carried out to provide a planar surface.

As the critical dimension of the integrated circuit devices shrinks to very deep sub-micron scale or beyond, it becomes more and more critical to fabricate reliable and effective device isolation in the art. However, conventional CVD methods have no longer provided satisfactory step coverage when dealing with high aspect ratio trenches, which are typically encountered in the fabrication of advanced integrated circuits. To overcome this, ozone-assisted sub-atmospheric pressure chemical vapor deposition (SACVD) techniques have been developed. Silicon oxide films employing the ozone-assisted SACVD techniques has superior gap filling ability that is particularly desirable for high aspect ratio trenches of limited trench dimension. After the SACVD film deposition, a high-temperature nitrogen anneal is performed to densify the deposited SACVD film. Typically, the densifying process is conducted in a furnace at a temperature no less than 1000° C.

However, the prior art SACVD techniques have several drawbacks when they are employed in the device isolation field. First, after the high-temperature anneal treatment, the deposited SACVD film is apt to shrink. For example, a shrinkage of about 7% has been observed after annealed at 1050° C. for 30 minutes. Besides, the film quality of the SACVD silicon oxide and its resistance to wet etchant are not high enough.

Another problem encountered when employing SACVD to form trench isolation regions is specifically depicted in FIG. 1. Since the SACVD film deposition is conformal and uniform along the sidewalls 22 of the trench 20, a seam defect 50 is left near the central line of the trench 20 when the trench is filled up. The seam defect 50 is concerned because it cannot be removed by mere high-temperature nitrogen anneal as mentioned supra, and because it is subject to corrosion or attacks by the wet etchant used in the subsequent wet cleaning procedures.

In light of the above, there is a need in this industry to provide an improved trench-fill process utilizing SACVD technique, which can produce a high-quality, seamless trench fill profile.

SUMMARY OF INVENTION

It is the primary object of the present invention to provide a seamless trench-fill process utilizing sub-atmospheric pressure chemical vapor deposition (SACVD) technique.

According to the claimed invention, a method of forming a trench isolation region is disclosed. A substrate having thereon a mask layer is provided. Lithographic and etching processes is then carried out to form an opening in the mask layer. The opening exposes a portion of the substrate. The substrate is etched through the opening, thereby forming a trench. A sub-atmospheric pressure chemical vapor deposition (SACVD) process is performed to deposit a silicon oxide layer in the trench. The silicon oxide layer fills the trench and lefts a seam defect near its center. A steam anneal is then carried out in hydrogen/oxygen ambient and at a temperature of lower than 800° C. for a time period of at least 30 minutes to eliminate the seam defect. A nitrogen anneal process is performed at a temperature of higher than 900° C. to densify the silicon oxide layer.

These and other objectives of the present invention will no doubt become obvious to those of ordinary skill in the art after reading the following detailed description of the preferred embodiment that is illustrated in the various figures and drawings.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION

Figure 1:
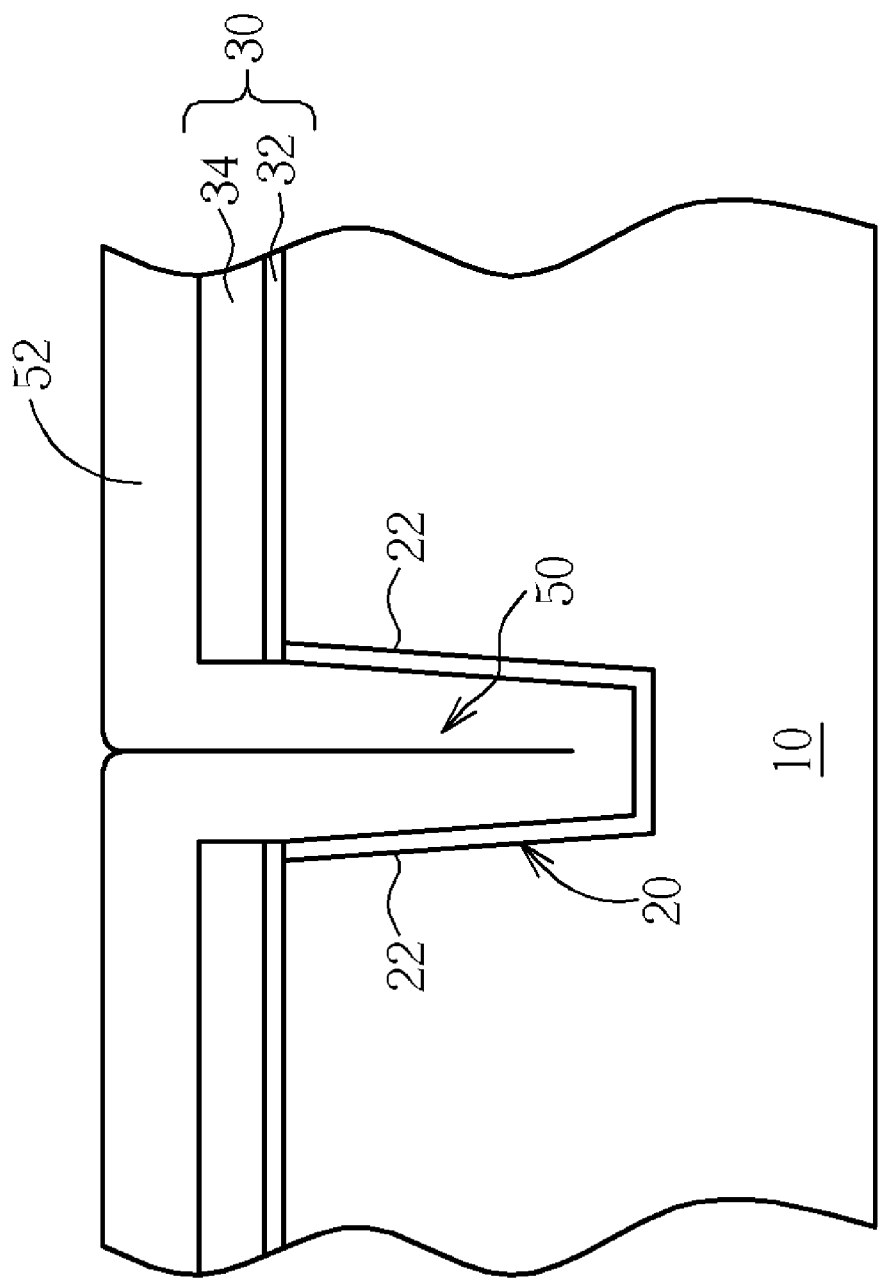
FIG. 1 is a schematic, cross-sectional diagram showing the seam defect in the trench according to the prior art method.
Figure 2:
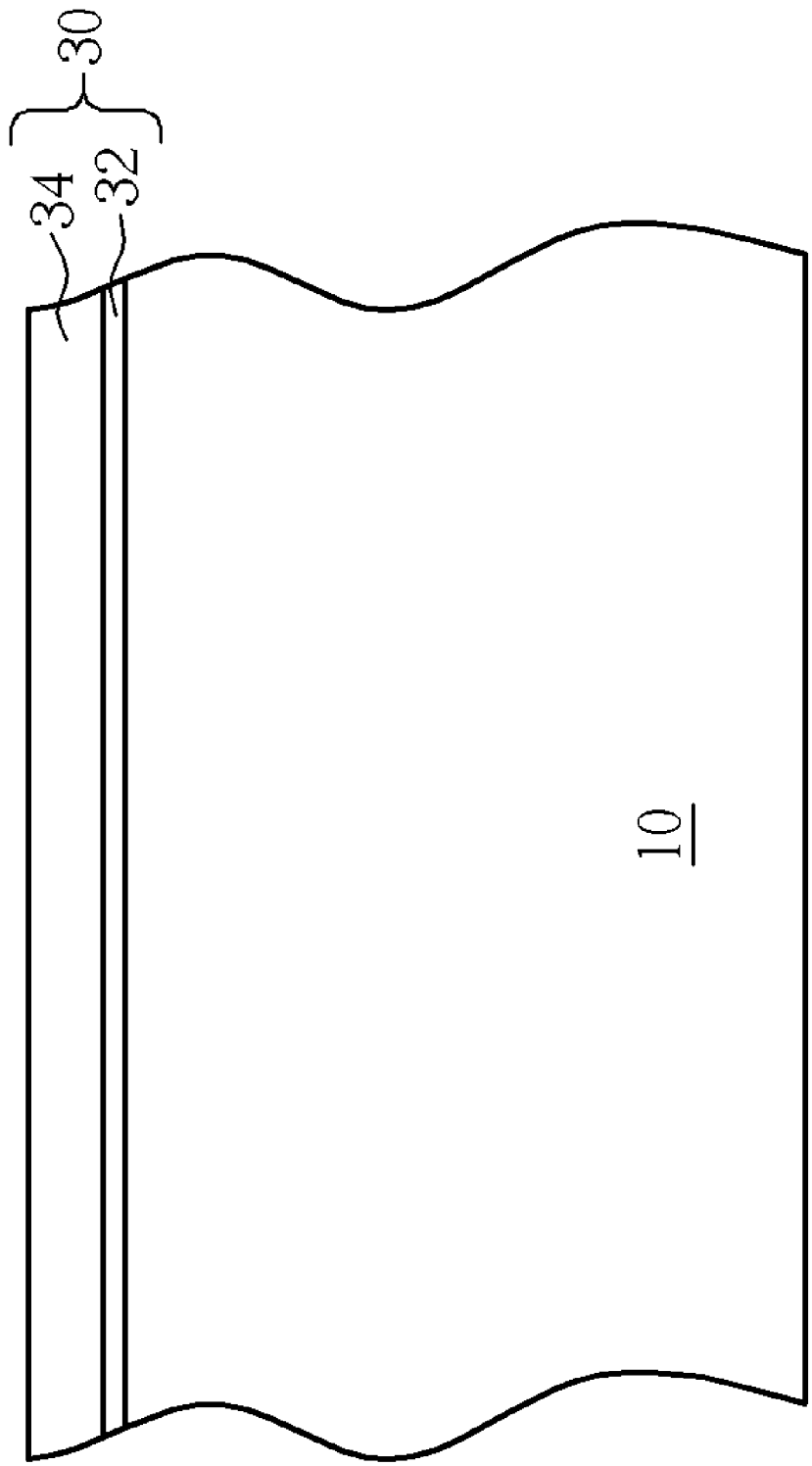
FIG. 2 to FIG. 5 are schematic, cross-sectional diagrams showing one preferred embodiment of this invention.

Please refer to FIG. 2 to FIG. 5. First, as shown in FIG. 2, a pad oxide layer 32 having a thickness of about 30–200 angstroms is formed on a semiconductor substrate 10 such as a silicon substrate. The pad oxide layer 32 may be formed by chemical vapor deposition methods or thermal growth. Subsequently, a silicon nitride pad layer 34 having a thickness of about 500–2000 angstroms is deposited on the pad oxide layer 32. The pad oxide layer 32 and the silicon nitride pad layer 34 serve as a mask layer 30.

Figure 3:
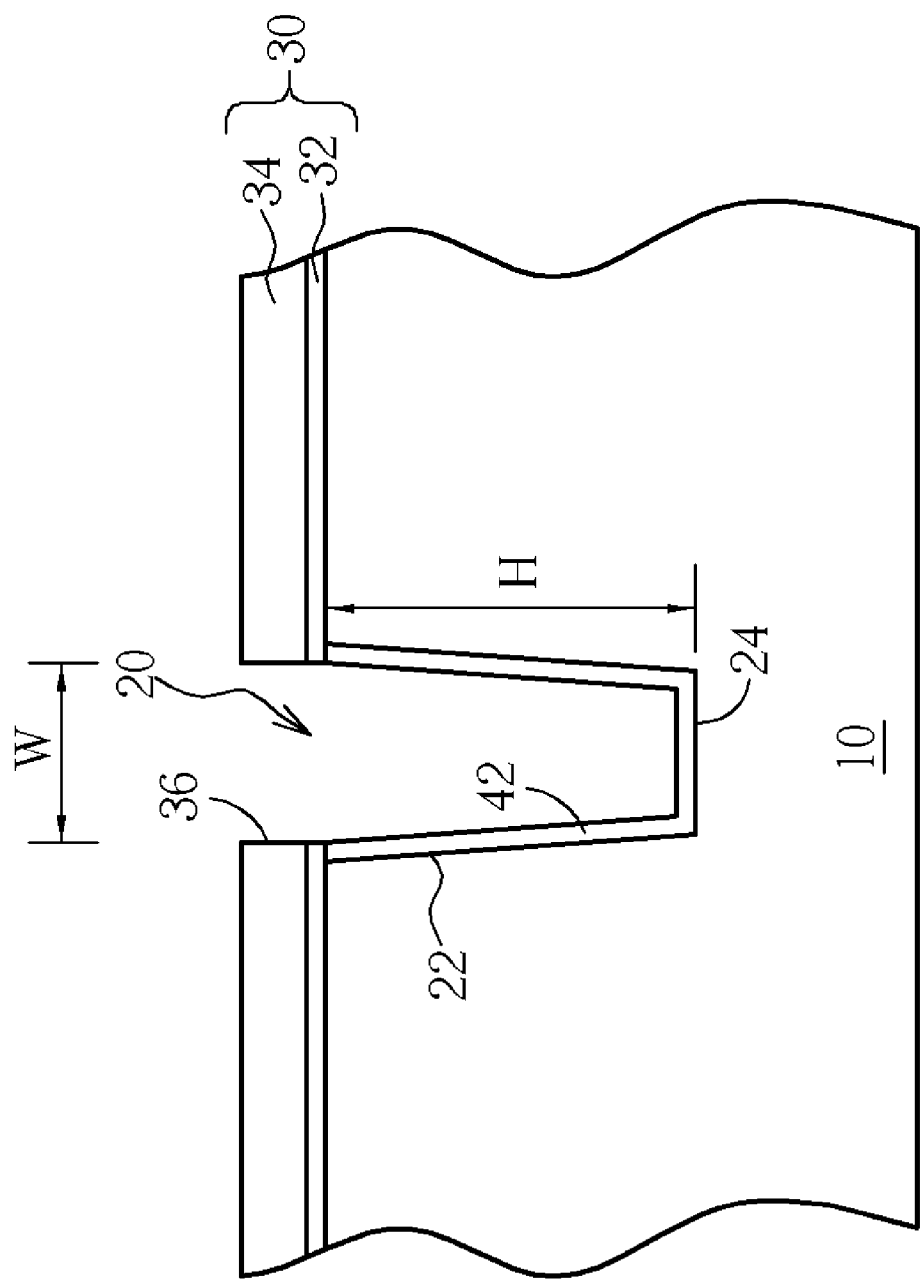

As shown in FIG. 3, conventional lithographic and etching processes are carried out to form an opening 36 in the mask layer 30. The opening 36 exposes a portion of the underlying semiconductor substrate 10. Using the mask layer 30 as an etching hard mask, the exposed semiconductor substrate 10 is etched through the opening 36, thereby forming a trench 20 having a trench depth of about 3500–6000 angstroms. This invention is particularly suited for the trench 20 that has an aspect ratio (i.e., the ratio of the trench depth to the trench width; H/W) of no less than 4.5. Subsequently, a thermal oxidation process is performed to form a silicon oxide liner layer 42 on the sidewall 22 and bottom 24 of the trench 20.

Figure 4:
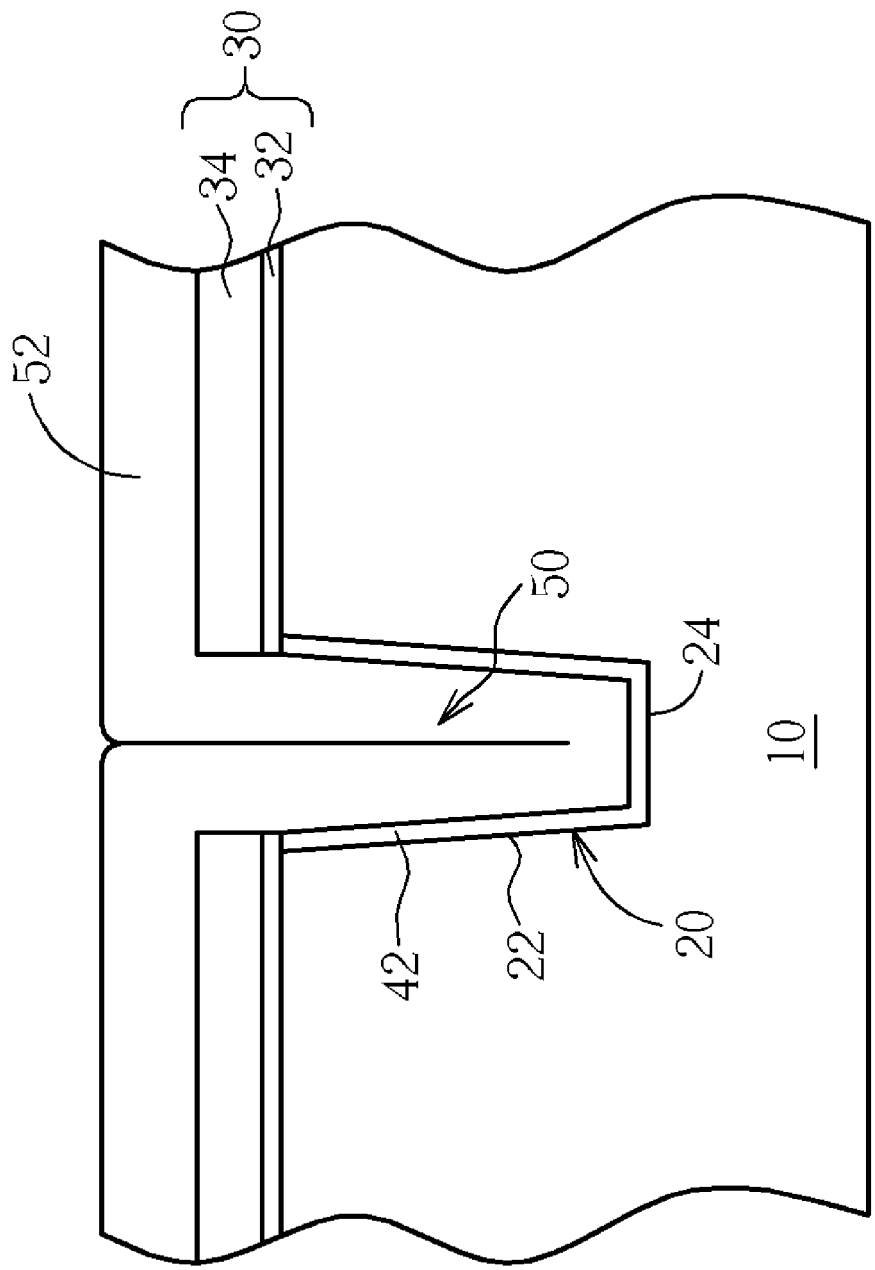
Figure 5:
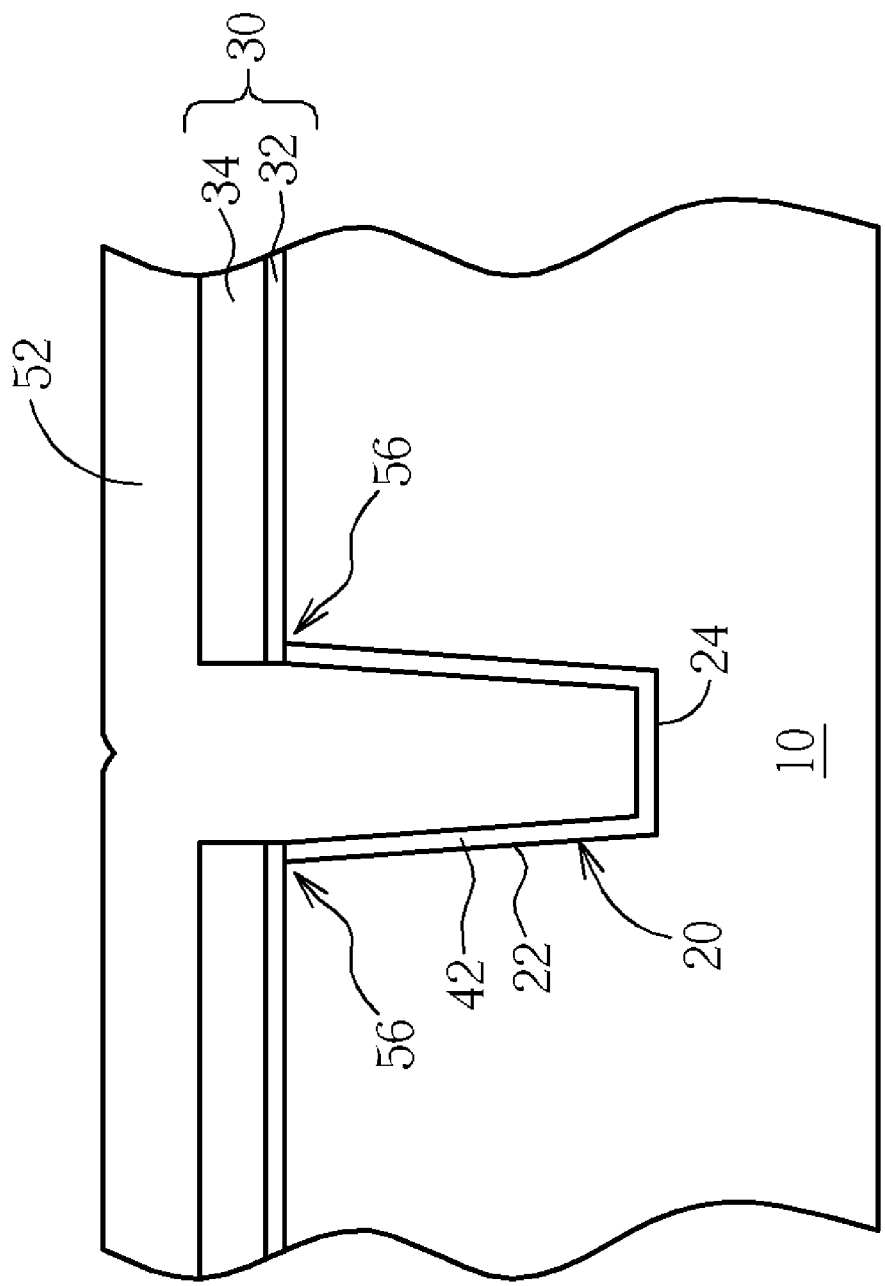

As shown in FIG. 4, an ozone-assisted sub-atmospheric pressure chemical vapor deposition (SACVD) process is carried out to deposit a conformal silicon oxide layer 52 into the trench 20. The silicon oxide layer 52 is formed by employing tetra-ethyl-ortho-silicate (TEOS) as a silicon source. Typically, the SACVD may be carried out at a sub-atmospheric pressure of about 60 torrs. The silicon oxide layer 52 fills the trench 20 and covers the mask layer 30. A seam defect 50 is left near the central line of the trench 20 due to the deposition properties of the SACVD. As mentioned, the seam defect 50 cannot be eliminated by conventional high-temperature (900–1100° C.) nitrogen anneal.

According to one preferred embodiment of this invention, the silicon oxide layer 52 may be deposited by either single-step or multi-step SACVD. In a single-step SACVD process, the silicon oxide layer 52 is deposited to a desired thickness by employing constant ozone-to-TEOS ratio, while in a multi-step SACVD process, the silicon oxide layer 52 is deposited to a desired thickness by employing various ozone-to-TEOS ratios.

To eliminate the seam defect 50, a steam anneal is performed prior to the regular high-temperature nitrogen anneal. Compared to the regular high-temperature nitrogen anneal that is usually performed at 900–1100° C., the steam anneal of the present invention is performed at a relatively lower temperature ranging between about 500° C. and 800° C., preferably 700° C., for a time period of about 30–60 minutes. According to this invention, the steam anneal is carried out in a furnace in hydrogen/oxygen ($H_2/O_2$) ambient. The oxygen gas and hydrogen gas injected into the furnace are maintained at high flowrates of 5–20 L/min, for example, hydrogen gas flowrate: 15 L/min; oxygen gas flowrate: 10 L/min. Preferably, the hydrogen-to-oxygen ratio (volumetric flowrate ratio) is between 1:2 and 3:1.

It is suggested that the temperature of the steam anneal should not exceed 800° C., otherwise the edge 56 of the trench 20 would be oxidized, leading to trench corner rounding. The oxidation of the edge 56 of the trench 20 also influences the limited active area. Further, the maintenance of high flowrates of both hydrogen gas and oxygen gas in the steam anneal process is also emphasized. According to the experimental results, only steam anneal employing such high flowrates of hydrogen gas and oxygen gas can effectively remove the seam defect 50 from the trench 20.

After the steam anneal process, a regular high-temperature nitrogen anneal is carried out at a temperature of about 900–1100° C. to densify the silicon oxide layer 52. The regular high-temperature nitrogen anneal may be carried out in other inert gas ambient. The steam anneal and the later nitrogen anneal may be performed either in-situ in one furnace, or ex-situ in different anneal equipments. To complete the trench isolation, a chemical mechanical polishing (CMP) may be performed.

Figure 6:
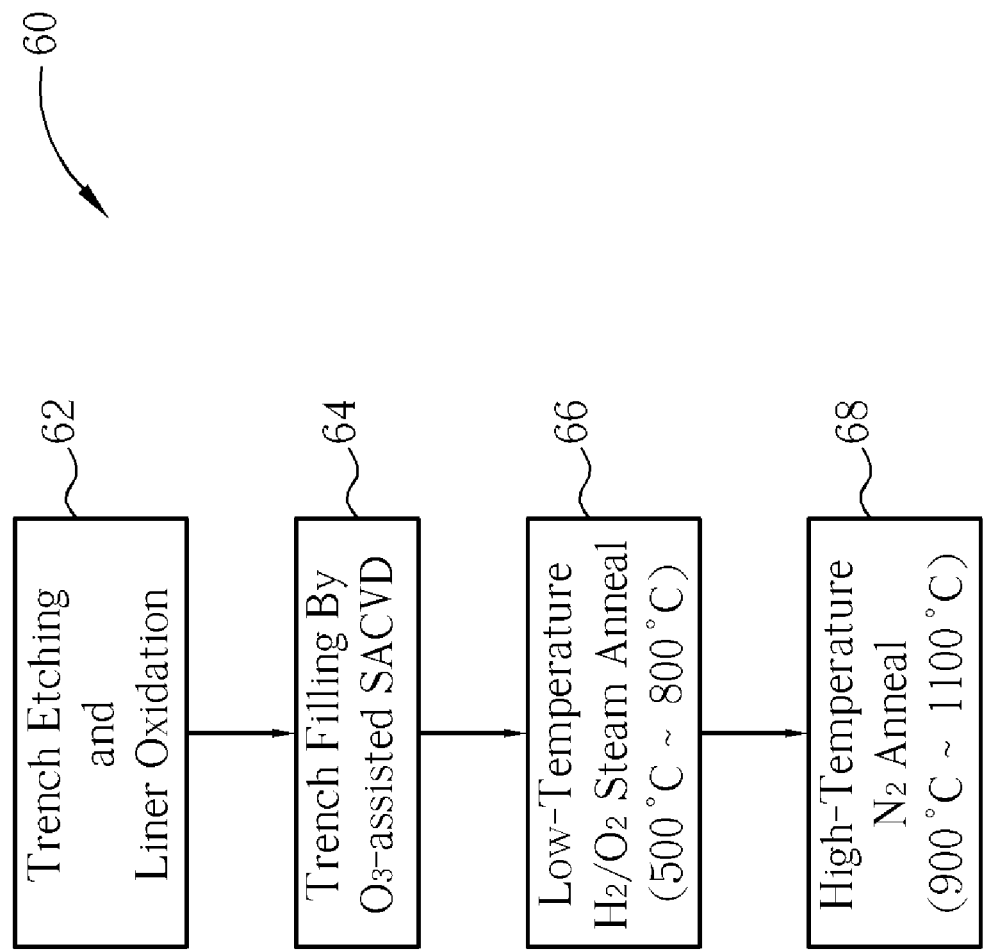
FIG. 6 is a flow chart showing the seamless trench-fill process in accordance with the present invention.

FIG. 6 is a flow chart 60 showing the seamless trench-fill process in accordance with the present invention. In short, the present invention method mainly includes four steps:

Step 62: Trench etching and liner oxidation.
Step 64: Ozone-assisted SACVD to form SACVD film.
Step 66: Low-temperature steam anneal (500–800° C.) to eliminate seam defect.
Step 68: High-temperature nitrogen anneal (900–1100° C.) to densify SACVD film.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of forming a trench isolation region, comprising:
    providing a substrate having thereon a mask layer;
    performing lithographic and etching processes to form an opening in said mask layer, said opening exposes a portion of said substrate;
    etching said substrate through said opening, thereby forming a trench;
    performing a sub-atmospheric pressure chemical vapor deposition (SACVD) process to deposit a silicon oxide layer in said trench, wherein said silicon oxide layer fills said trench and leaves a seam defect near its center;
    performing a steam anneal in hydrogen/oxygen ambient and at a temperature of lower than 800° C. to eliminate said seam defect; wherein said steam anneal is carried out at a relatively higher hydrogen flowrate of 5–20 L/min and oxygen flowrate of 5–20 L/min with hydrogen-to-oxygen ratio (volumetric flowrate ratio) between 1:2 and 3:1; and
    performing a densifying anneal process at a temperature of higher than 900° C. to densify said silicon oxide layer.

2. The method of forming a trench isolation region according to claim 1 wherein said mask layer comprises a pad oxide layer and a silicon nitride pad layer.

3. The method of forming a trench isolation region according to claim 1 wherein said SACVD process is an ozone-assisted SACVD employing tetra-ethyl-ortho-silicate (TEOS) as a silicon source.

4. The method of forming a trench isolation region according to claim 1 wherein said steam anneal is performed for at least 30 minutes.

5. The method of forming a trench isolation region according to claim 1 wherein said steam anneal is performed at a temperature of 500–800° C.

* * * * *